(12) United States Patent
Nakamura et al.

(10) Patent No.: US 7,338,902 B2
(45) Date of Patent: Mar. 4, 2008

(54) EPITAXIAL GROWTH METHOD AND SUBSTRATE FOR EPITAXIAL GROWTH

(75) Inventors: Masashi Nakamura, Toda (JP); Hideki Kurita, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 48 days.

(21) Appl. No.: 10/534,695

(22) PCT Filed: May 14, 2003

(86) PCT No.: PCT/JP03/05987

§ 371 (c)(1),
(2), (4) Date: May 13, 2005

(87) PCT Pub. No.: WO2004/051725

PCT Pub. Date: Jun. 17, 2004

(65) Prior Publication Data

US 2006/0012010 A1   Jan. 19, 2006

(30) Foreign Application Priority Data

Dec. 3, 2002   (JP)   ............................. 2002-350704

(51) Int. Cl.
*H01L 21/44* (2006.01)
(52) U.S. Cl. .................................................. 438/681
(58) Field of Classification Search ............... 148/33.4; 438/681
See application file for complete search history.

(56) References Cited

U.S. PATENT DOCUMENTS 5,647,917 A * 7/1997 Oida et al. ................. 148/33.4

FOREIGN PATENT DOCUMENTS

| JP | 2-239188 A | 9/1990 |
|---|---|---|
| JP | 8-330236 A | 12/1996 |
| JP | 2750331 B2 | 2/1998 |

OTHER PUBLICATIONS

Nakamura et al., Journal of Crystal Growth, vol. 129, 1993, pp. 456-464.

* cited by examiner

*Primary Examiner*—Carl Whitehead, Jr.
*Assistant Examiner*—Monica D. Harrison
(74) *Attorney, Agent, or Firm*—Birch, Stewart, Kolasch & Birch, LLP

(57) ABSTRACT

An epitaxial growth method includes: supporting a substrate for growth (for example, an InP substrate) with a substrate supporter, growing a compound semiconductor layer comprising 3 or 4 elements (for example, a III-V group compound semiconductor such as an InGaAs layer, AlGaAs layer, AlInAs layer and AlInGaAs layer) on the substrate for growth by metal organic chemical vapor deposition, polishing the substrate so that an angle of gradient is 0.00° to 0.03° or 0.04° to 0.24° with respect to (100) direction in the entire effective area of the substrate, and forming the compound semiconductor layer to be 0.5 µm thick or more on the substrate by using the substrate for growth.

16 Claims, 2 Drawing Sheets

(a)            (b)

EPITAXIAL GROWTH METHOD AND SUBSTRATE FOR EPITAXIAL GROWTH

TECHNICAL FIELD

The present invention relates to an epitaxial growth method or a substrate for epitaxial growth, for forming a compound semiconductor layer on a semiconductor substrate by metal organic chemical vapor deposition, and especially relates to a technique for improving surface morphology of the compound semiconductor.

BACKGROUND ART

In earlier development, a semiconductor wafer has been widely used for a semiconductor element such as a luminous element and light receiving element, in which a III-V group ternary or quaternary compound semiconductor layer such as an InGaAs layer, AlGaAs layer, InAlAs layer, InAlGaAs layer and InGaAsP layer and an InP layer are sequentially grown onto an InP substrate by epitaxial growth. The epitaxial layer of this semiconductor wafer is, for example, formed by metal organic chemical vapor deposition (hereinafter referred to as an MOCVD method).

However, when epitaxial growth of the above-described III-V group compound semiconductor is performed by the MOCVD method, it has been problematic that hillock-like defect occurs on the surface of the epitaxial layer to cause inferior surface morphology. Therefore, various techniques for improving surface morphology of the epitaxial layer have been developed.

For example, JP2750331B (patent document 1) discloses that plane orientation of a substrate in epitaxial growth is regulated in order to reduce a teardrop-like defect (synonymous with a hillock-like defect) occurring on a surface of a growth film. Concretely, plane orientation of a compound semiconductor single crystal substrate to be used is regulated according to a growth temperature and growth rate in growing the epitaxial layer, so that an occurrence of the teardrop-like defect is effectively reduced.

Further, a similar technique with the above patent document 1 is disclosed in Journal of Crystal Growth 129(1993) P456-464, M. Nakamura et al. (non-patent literature 1).

However, when a III-V group compound semiconductor layer such as InGaAs layer, AlGaAs layer, AlInAs layer and AlInGaAs layer is grown on a InP substrate by the above-described technique of prior art, aberrant rough morphology different from hillock-like defect is sometimes observed on a surface of an epitaxial growth layer (hereinafter referred to as aberrant surface morphology) (see FIG. 1).

The present invention is made in order to solve the above problems. The object of the invention is to provide an epitaxial growth method and a substrate for growth used for epitaxial growth, in which occurrence of the aberrant surface morphology is effectively prevented in a course of growing a III-V group compound semiconductor layer such as InGaAs layer, AlGaAs layer, AlInAs layer and AlInGaAs layer on a InP substrate.

DISCLOSURE OF INVENTION

Hereinafter, a history to accomplish the present invention is briefly explained.

Firstly, the present inventors investigated surface morphology of a semiconductor wafer in which an InGaAs layer had been grown on an InP substrate by the above-described technique of prior art. As a result, when the InGaAs layer was grown to be thinner than 0.5 µm thick, the aberrant surface morphology as shown in FIG. 1 was not observed at all, and only when the InGaAs layer was grown to be thicker than 0.5 µm, aberrant surface morphology was observed.

The aberrant surface morphology may occur along with edges of a substrate as shown in FIG. 2(a), or at approximately a half area of a substrate as shown in FIG. 2(b). It was found that the generation part varied according to substrates to be used. The present inventors presumed that plane orientation generally has slight variation in an entire area of a substrate, which caused the substrates to show various generation status (generation part) of aberrant surface morphology as described above.

As a result of a further investigation based on this presumption, it was revealed that the aberrant surface morphology especially occurred at a part having certain specific plane orientation, for example one inclined 0.03° to 0.04° with respect to (100) surface. That is, occurrence of the above-described aberrant surface morphology was based on an generation mechanism inherently different from that of a hillock-like defect which occurs at dislocation part of a substance, and it only depended on plane orientation of a substrate without any relation to dislocation of a substrate.

On the basis of the above, the inventors acquired a knowledge that occurrence of the aberrant surface morphology can be prevented by using a substrate not having certain plane orientation in the entire area of the substrate, when a III-V group compound semiconductor layer such as InGaAs layer is grown to be 0.5 µm thick or more by epitaxial growth on a substrate for growth such as InP single crystal.

The present invention is made on the basis of the above knowledge, and is an epitaxial growth method comprising supporting a substrate for growth with a substrate supporter, growing a compound semiconductor layer comprising three or four elements on the semiconductor substrate by metal organic chemical vapor deposition, polishing the substrate so that an angle of gradient direction is 0.00° to 0.03° or 0.04° to 0.24° with respect to (100) in an entire effective area of the substrate, and forming the compound semiconductor layer to be 0.5 µm thick or more on the substrate by using the substrate for growth. That is, since the aberrant surface morphology occurs in the case that the angle of gradient with respect to (100) surface is 0.03° to 0.04°, a substrate not including a portion having such plane orientation is used.

Here, the effective area designates a center part of a substrate, eliminating a rolled edge occurring in mirror finishing process located at the most peripheral part thereof (approximately 3 mm width from the circumference of the substrate).

Note that, as shown in the above non-patent literature 1, other aberrant morphology of step-like shape occurs on a surface of a compound semiconductor layer, when an angle of gradient is 0.24° or more. Thus, the upper limit of the angle of gradient is set to 0.24°.

As a result, when a compound semiconductor is grown on a semiconductor substrate with epitaxial growth by using MOCVD method, occurrence of the aberrant surface morphology can be effectively prevented even in the case that the compound semiconductor layer is formed to be more than 0.5 µm thick.

The compound semiconductor layer may be formed on the substrate for growth by the intermediary of a buffer layer. By doing so, the compound semiconductor layer having superior crystal quality can be grown with epitaxial growth.

Further, it is also effective in growing a III-V group compound semiconductor layer containing at least As on the substrate for growth. In particular, it is suitable when the compound semiconductor layer is an InGaAs layer or InAlAs layer.

The above non-patent literature 1 discloses that a hillock-like defect occurs when an angle of gradient is 0.00° to 0.03°. However, as described above, the hillock-like defect occurs only at a crystal having dislocation. Thus, the occurrence of hillock-like defect can be prevented by using a crystal substrate having sufficiently low dislocation density or no dislocation. Concretely, it is desirable to use a semiconductor crystal substrate having dislocation density of 5000 cm$^{-2}$ or less.

For example, it is desirable to use a sulfur doped InP substrate when the above III-V group compound semiconductor is grown with epitaxial growth.

In the above-described epitaxial growth method, the substrate for growth which has been previously polished so that an angle of gradient is 0.00° to 0.03° or 0.04° to 0.24° with respect to (100) direction in entire effective area of the substrate may be used.

BEST MODE FOR CARRYING OUT THE INVENTION

Hereinafter, a preferable embodiment of the present invention is explained with reference to the drawings.

Firstly, an InP single crystal grown in (100) direction was manufactured with liquid encapsulated Czochralski (LEC) method in order to obtain the substrate for growth to which the present invention is to be applied. Sulfur, tin and iron were respectively used as a dopant so that a plurality of InP single crystals having different dislocation densities each other were obtained. The dislocation densities of the InP single crystals were 500 cm$^{-2}$ or less (sulfur dope), 5000 cm$^{-2}$ (tin dope) and 20000 cm$^{-2}$ (iron dope) respectively.

Each InP single crystal was formed to be a circular cylinder of 2 inches diameter, and sliced to obtain an InP substrate in which the surface thereof slopes 0.00° to 0.30° with respect to (100) surface.

Figure 3:
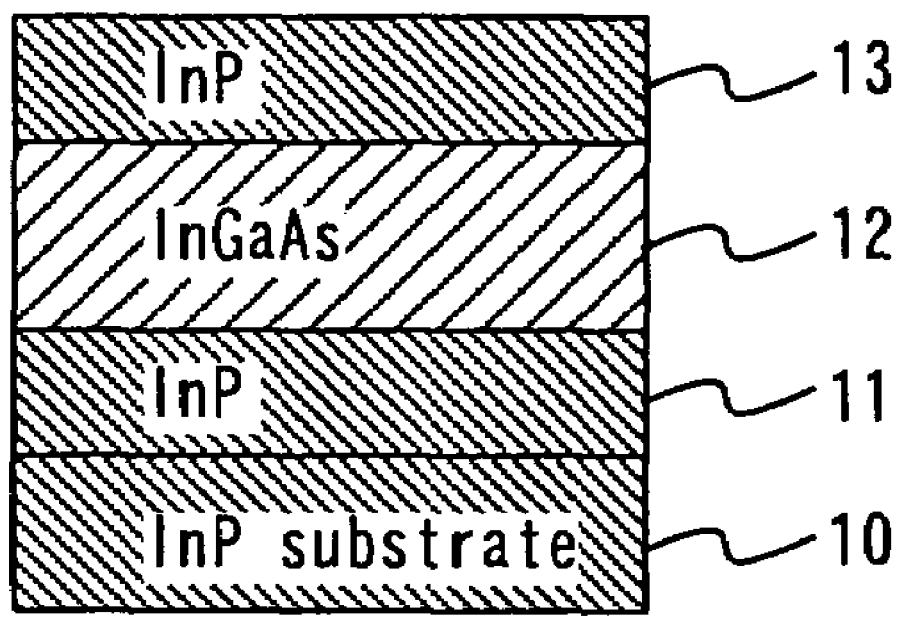
FIG. 3 is a schematic view showing laminated structure of the semiconductor wafer of the present embodiment.

Subsequently, an epitaxial layer was formed onto these substrates with metal organic chemical vapor deposition, so that semiconductor wafer of a laminated structure as shown in FIG. 3 was manufactured. Concretely, an InP buffer layer 11 of 0.5 μm thick was formed onto an InP substrate 10, and an InGaAs layer 12 of 0.3 to 2.5 μm thick is formed thereon. Furthermore, an InP layer 13 of 0.5 μm thick is formed. These layers were grown sequentially with epitaxial growth.

In the epitaxial growth, growth temperature was set to 640° C., growth pressure is set to 50 torr, and total gas flow is set to 60l/min. Further, growth rate of the InGaAs layer 12 was set to 1.0 μm/h, and growth rates of the InP layers 11 and 13 were set to 2.0 μm/h.

Figure 1:
FIG. 1 is a micrograph of the aberrant morphology occurring on a surface of an epitaxial layer.
Figure 2:
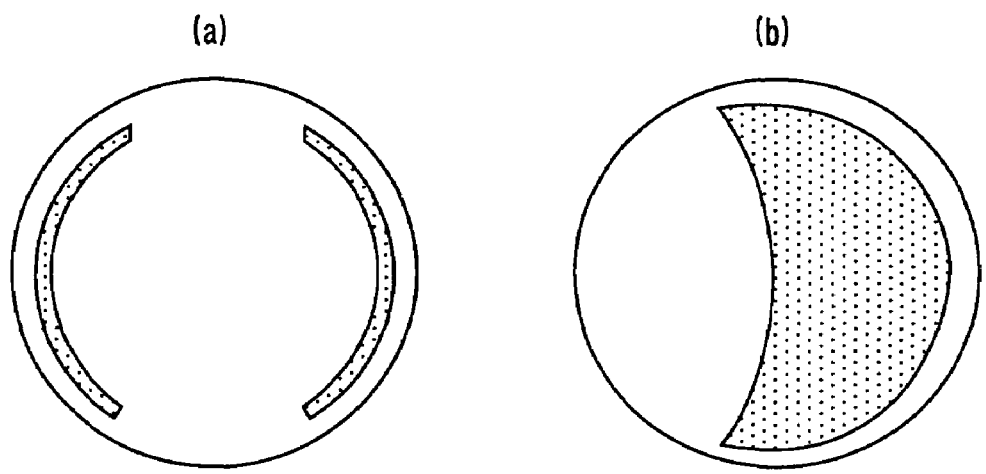
FIG. 2 is an explanatory drawing showing a generation point of the aberrant morphology on a surface of an epitaxial layer.

As for the obtained semiconductor wafer, surface morphology of the InP layer 13 was observed under microscope and generation status of the aberrant surface morphology (FIG. 1), hillock-like defect and step-like defect were investigated.

One of examples of the observation results is shown in TABLE 1.

TABLE 1

| No. | DOPANT | DISLOCATION DENSITY (cm$^{-2}$) | ANGLE OF GRADIENT (°) | InGaAs FILM THICKNESS (μm) | ABERRANT MORPHOLOGY | HILLOCK-LIKE DEFECT | STEP-LIKE DEFECT |
|---|---|---|---|---|---|---|---|
| 1 | SULFUR | <500 | 0.000 | 2.5 | ABSENCE | ABSENCE | ABSENCE |
| 2 | SULFUR | <500 | 0.025 | 2.5 | ABSENCE | ABSENCE | ABSENCE |
| 3 | SULFUR | <500 | 0.032 | 0.3 | ABSENCE | ABSENCE | ABSENCE |
| 4 | SULFUR | <500 | 0.032 | 0.45 | ABSENCE | ABSENCE | ABSENCE |
| 5 | SULFUR | <500 | 0.032 | 1.0 | PRESENCE | ABSENCE | ABSENCE |
| 6 | SULFUR | <500 | 0.032 | 2.5 | PRESENCE | ABSENCE | ABSENCE |
| 7 | SULFUR | <500 | 0.035 | 2.5 | PRESENCE | ABSENCE | ABSENCE |
| 8 | SULFUR | <500 | 0.070 | 2.5 | ABSENCE | ABSENCE | ABSENCE |
| 9 | SULFUR | <500 | 0.100 | 2.5 | ABSENCE | ABSENCE | ABSENCE |
| 10 | SULFUR | <500 | 0.150 | 2.5 | ABSENCE | ABSENCE | ABSENCE |
| 11 | SULFUR | <500 | 0.200 | 2.5 | ABSENCE | ABSENCE | ABSENCE |
| 12 | SULFUR | <500 | 0.300 | 2.5 | ABSENCE | ABSENCE | PRESENCE |
| 13 | TIN | 5000 | 0.000 | 2.5 | ABSENCE | PRESENCE | ABSENCE |
| 14 | TIN | 5000 | 0.020 | 2.5 | ABSENCE | PRESENCE | ABSENCE |
| 15 | TIN | 5000 | 0.035 | 2.5 | PRESENCE | PRESENCE | ABSENCE |
| 16 | TIN | 5000 | 0.070 | 2.5 | ABSENCE | ABSENCE | ABSENCE |
| 17 | TIN | 5000 | 0.100 | 2.5 | ABSENCE | ABSENCE | ABSENCE |
| 18 | TIN | 5000 | 0.150 | 2.5 | ABSENCE | ABSENCE | ABSENCE |
| 19 | TIN | 5000 | 0.200 | 2.5 | ABSENCE | ABSENCE | ABSENCE |
| 20 | IRON | 20000 | 0.020 | 2.5 | ABSENCE | PRESENCE | ABSENCE |
| 21 | IRON | 20000 | 0.028 | 2.5 | ABSENCE | PRESENCE | ABSENCE |
| 22 | IRON | 20000 | 0.035 | 0.3 | ABSENCE | PRESENCE | ABSENCE |
| 23 | IRON | 20000 | 0.035 | 0.45 | ABSENCE | PRESENCE | ABSENCE |
| 24 | IRON | 20000 | 0.035 | 1.0 | PRESENCE | PRESENCE | ABSENCE |
| 25 | IRON | 20000 | 0.035 | 2.5 | PRESENCE | PRESENCE | ABSENCE |
| 26 | IRON | 20000 | 0.100 | 2.5 | ABSENCE | ABSENCE | ABSENCE |
| 27 | IRON | 20000 | 0.150 | 2.5 | ABSENCE | ABSENCE | ABSENCE |
| 28 | IRON | 20000 | 0.200 | 2.5 | ABSENCE | ABSENCE | ABSENCE |

As a result, in the case of the epitaxial film having an InGaAs layer of thinner than 0.5 μm thick, the aberrant morphology was not observed regardless of dislocation density and plane orientation of the used substrate (samples 3, 4, 22 and 23).

On the other hand, in the case that an InGaAs layer of thicker than 0.5 μm was grown, the aberrant surface morphology was observed in any substrates regardless of kind of the dopant and dislocation density when an angle of gradient was 0.035° and 0.037° (samples 5 to 7, 15, 24 and 25). Note that even in the case that an InGaAs layer of thicker than 0.5 μm was grown, the aberrant surface morphology was not observed when an angle of gradient with respect to (100) surface was other than 0.035° and 0.037° (samples 1, 2, 8 to 14, 16 to 21 and 26 to 28).

As for the hillock-like defect, as shown in the above patent document 1 and non-patent literature 1 and the like, it was observed when a substrate was a tin doped InP substrate or iron doped InP which were recognized as a crystal having dislocation substrate and an angle of gradient was 0.00° to 0.05° with respect to (100) (samples 13 to 15 and 20 to 25).

As for the step-like defect, as shown in the above non-patent literature 1, it was observed when an angle of gradient is 0.30° or more (sample 12).

As described above, when an InGaAs layer was grown to be 0.5 μm thick or more with epitaxial growth, occurrence of the aberrant surface morphology could be prevented by using the substrates having an angle of gradient with respect to (100) surface of 0.00° to 0.03° or 0.04° or more. Further, occurrence of hillock-like defect could be prevented by using the substrates having dislocation density of 5000 $cm^{-2}$ or less, and occurrence of step-like defect could be prevented when an angle of gradient was 0.25° or less with respect to (100) surface.

In the above embodiments, an example where an InGaAs layer is grown on an InP substrate with epitaxial growth is explained. The present invention can be applied to a case where the III-V group compound semiconductor layer comprising 3 or 4 elements including at least As (for example, an AlGaAs layer, AlInAs layer and AlInGaAs layer) is grown to be more than 0.5 μm thick on the InP substrate with epitaxial growth, similarly with the above case.

In the above embodiment, an InP single crystal grown in (100) direction in the entire effective area with LEC method is processed so as to obtain a desired substrate for growth. However a substrate for growth which has been previously polished so that an angle of gradient is 0.00° to 0.03° or 0.04° to 0.24° with respect to (100) direction also can be used.

According to the present invention, an epitaxial growth method comprises supporting a substrate for growth with a substrate supporter, growing a compound semiconductor layer comprising 3 or 4 elements on the semiconductor substrate by metal organic chemical vapor deposition, polishing the substrate so that an angle of gradient with respect to (100) direction is 0.00° to 0.03° or 0.04° to 0.24° in an entire effective area of the substrate, and forming the compound semiconductor layer to be 0.5 μm thick or more on the substrate by using the substrate for growth. Thus, the present invention is successful in that occurrence of aberrant surface morphology in the formed compound semiconductor layer is effectively prevented.

INDUSTRIAL APPLICABILITY

The present invention can be applied not only to a case where a III-V group compound semiconductor layer is grown on an InP substrate, but also to a case where the compound semiconductor layer is grown on a crystal substrate with epitaxial growth using the crystal substrate in which a difference of lattice constant is small between the substrate and the compound semiconductor layer to be grown.

The invention claimed is:

1. An epitaxial growth method comprising: supporting a substrate for growth with a substrate supporter, forming a III-V compound semiconductor layer comprising 3 or 4 elements on the substrate for growth by metal organic chemical vapor deposition, polishing the substrate so that an angle of gradient is not in the range from above 0.03° to below 0.04° with respect to (100) direction in an entire effective area of the substrate, and forming the compound semiconductor layer to be 0.5 μm thick or more on the substrate by using the substrate for growth, wherein the 3 or 4 elements are selected from the group consisting of AlGaAs, AlInAs, AlInGaAs and combinations thereof, and wherein the dislocation density of the substrate is 5000 $cm^{-2}$ or less.

2. The epitaxial growth method as claimed in claim 1, further comprising: forming a buffer layer on the substrate for growth, and forming the compound semiconductor layer on the buffer layer.

3. The epitaxial growth method as claimed in claim 2, wherein the compound semiconductor layer comprises AlInAs.

4. The epitaxial growth method as claimed in claim 3, wherein the substrate for growth is a semiconductor crystal substrate having dislocation density of 5000 $cm^{-2}$ or less.

5. The epitaxial growth method as claimed in claim 4, wherein the substrate for growth is an InP substrate.

6. The epitaxial growth method as claimed in claim 2, wherein the substrate for growth is a semiconductor crystal substrate having a dislocation density of 5000 $cm^{-2}$ or less.

7. The epitaxial growth method as claimed in claim 6, wherein the substrate for growth is an InP substrate.

8. The epitaxial growth method as claimed in claim 1, wherein the compound semiconductor layer comprises AlInAs.

9. The epitaxial growth method as claimed in claim 8, wherein the substrate for growth is a semiconductor crystal substrate having dislocation density of 5000 $cm^{-2}$ or less.

10. The epitaxial growth method as claimed in claim 9, wherein the substrate for growth is an InP substrate.

11. The epitaxial growth method as claimed in claim 1, wherein the substrate for growth is a semiconductor crystal substrate having a dislocation density of 5000 $cm^{-2}$ or less.

12. The epitaxial growth method as claimed in claim 11, wherein the substrate for growth is an InP substrate.

13. A substrate for epitaxial growth used for an epitaxial growth method in which a compound semiconductor layer comprising 3 or 4 elements is formed on the substrate for growth by metal organic chemical vapor deposition, wherein an angle of gradient is not in the range from above 0.03° to below 0.04° with respect to (100) direction in an entire effective area of the substrate.

14. The substrate for epitaxial growth as claimed in claim 13, wherein the substrate is a semiconductor crystal substrate having dislocation density of 5000 $cm^{-2}$ or less.

15. The substrate for epitaxial growth as claimed in claim 14, wherein the substrate is an InP substrate.

16. The substrate for epitaxial growth as claimed in claim 13, wherein the substrate is an InP substrate.

* * * * *